(12) United States Patent
Toda et al.

(10) Patent No.: US 7,291,022 B2
(45) Date of Patent: Nov. 6, 2007

(54) IC SOCKET

(75) Inventors: Shinsaku Toda, Kanagawa (JP); Shuji Kajinuma, Kanagawa (JP); Masashi Inoue, Kanagawa (JP)

(73) Assignee: Tyco Elctronics AMP KK, Kanagawa-Ken (JP)

( * ) Notice: Subject to any disclaimer, the term of this patent is extended or adjusted under 35 U.S.C. 154(b) by 0 days.

(21) Appl. No.: 11/530,738

(22) Filed: Sep. 11, 2006

(65) Prior Publication Data

US 2007/0026717 A1    Feb. 1, 2007

Related U.S. Application Data

(63) Continuation of application No. 11/165,374, filed on Jun. 23, 2005, now abandoned.

(30) Foreign Application Priority Data

Jun. 23, 2004   (JP) ............................. 2004-184955

(51) Int. Cl.
*H01R 13/62*   (2006.01)
(52) U.S. Cl. ........................................ 439/73; 439/331
(58) Field of Classification Search .................. 439/73, 439/331, 525, 526
See application file for complete search history.

(56) References Cited

U.S. PATENT DOCUMENTS

| 6,086,387 | A | 7/2000 | Gallagher et al. |
| 6,174,188 | B1 | 1/2001 | Martucci |
| 6,722,909 | B1 | 4/2004 | McHugh et al. |
| 6,752,636 | B2 | 6/2004 | Ma |
| 6,780,024 | B2 | 8/2004 | Ma |
| 6,799,978 | B2 | 10/2004 | Ma et al. |
| 6,832,919 | B2 | 12/2004 | Ma et al. |
| 6,848,929 | B2 | 2/2005 | Ma |
| 6,872,083 | B2 | 3/2005 | Kanesashi |
| 6,908,315 | B2 | 6/2005 | Groot |
| 6,916,195 | B2 | 7/2005 | Byquist |
| 2003/0064619 | A1* | 4/2003 | Renfro et al. ................ 439/342 |
| 2004/0147156 | A1* | 7/2004 | Renfro et al. ................ 439/342 |

FOREIGN PATENT DOCUMENTS

| JP | 5-174924 | 7/1993 |
| JP | 6-151025 | 5/1994 |

* cited by examiner

*Primary Examiner*—Gary F. Paumen
(74) *Attorney, Agent, or Firm*—Barley Snyder LLC

(57) ABSTRACT

An IC package is guided to the proper position therefore on a mounting surface of an IC socket with good mounting workability, while preventing buckling and deformation of contacts. In addition, a guide member is enabled to be urged upward stably, without increasing the number of parts. The IC socket includes: an insulative housing that holds a plurality of contacts; a cover plate; and a lever. A guide member, which includes: a pair of guide rails for guiding the IC package; and a link member for linking the guide rails to each other, is attached to the housing. Spring arms for urging the guide member upward are provided on the guide rails and the link member. Regulating members that regulate upward movement of the guide member at a position, where the guided IC package does not contact the electrical contacts, are provided on the housing and the guide member.

20 Claims, 8 Drawing Sheets

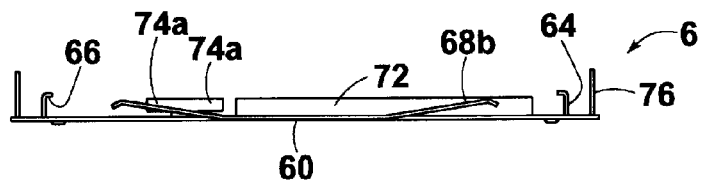
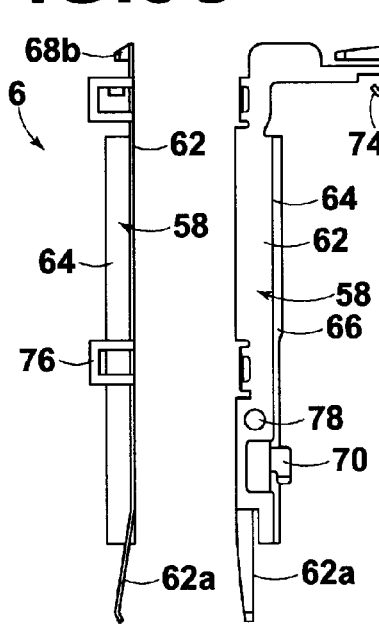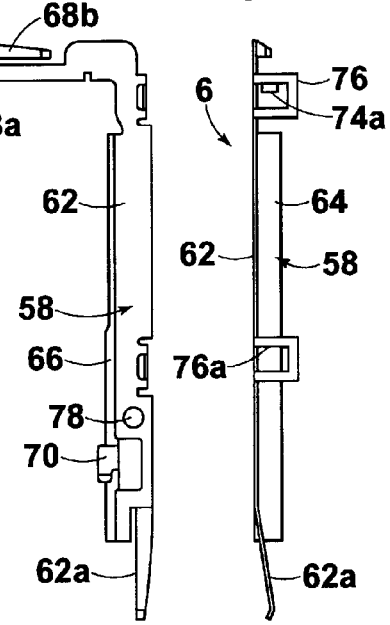
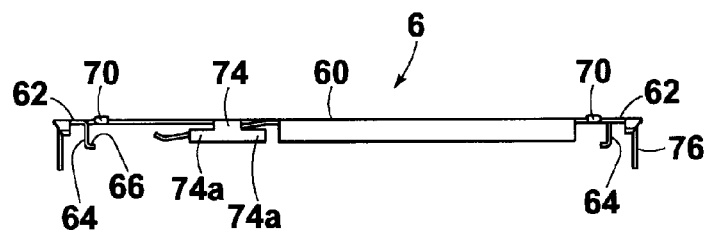

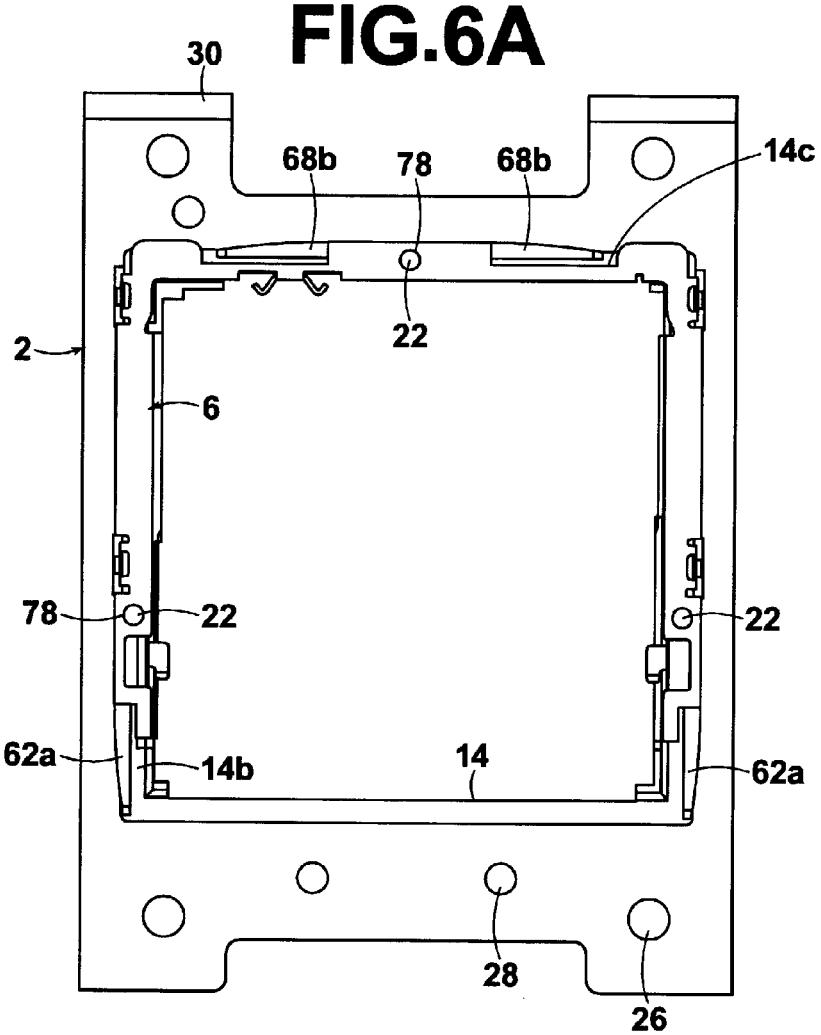
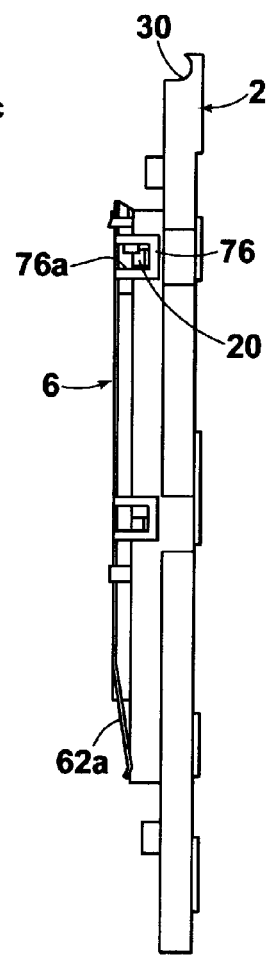
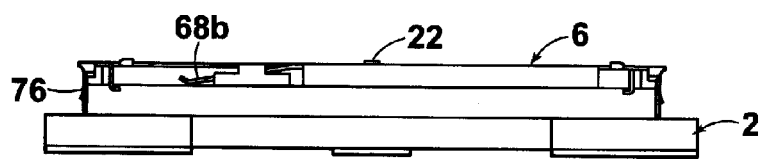

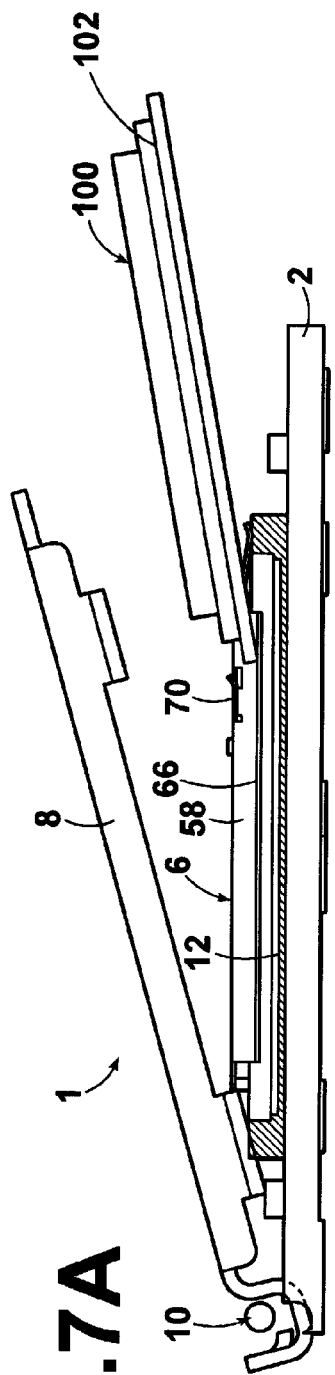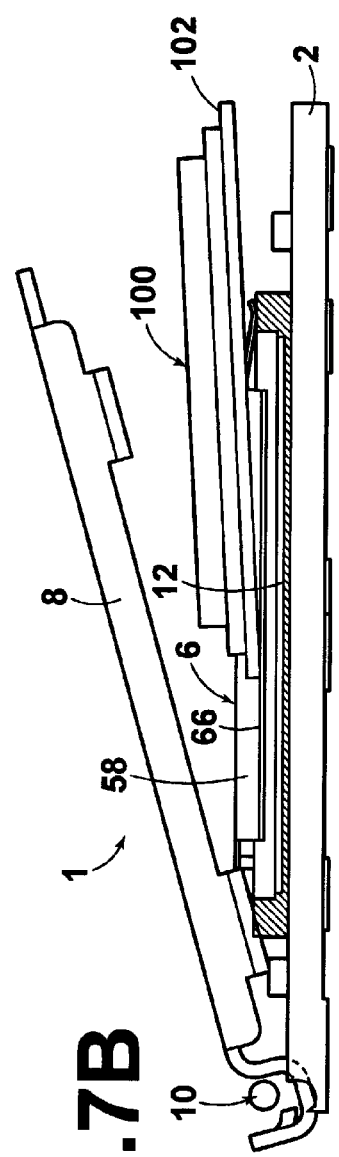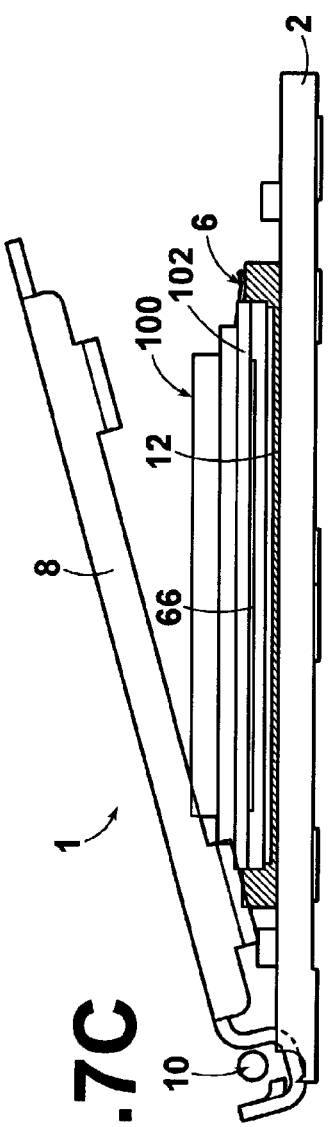

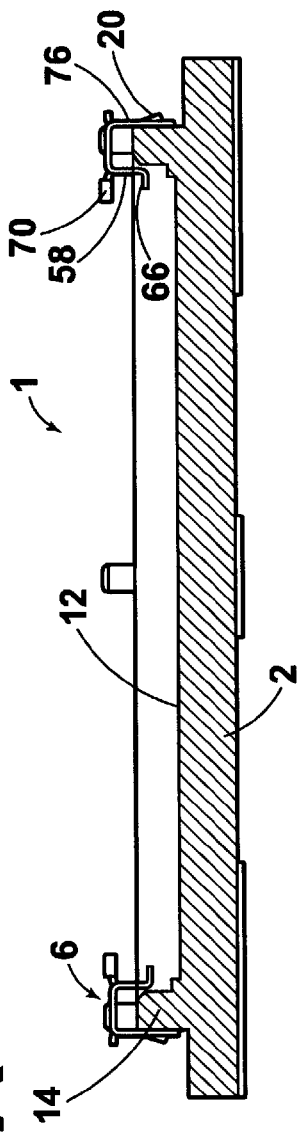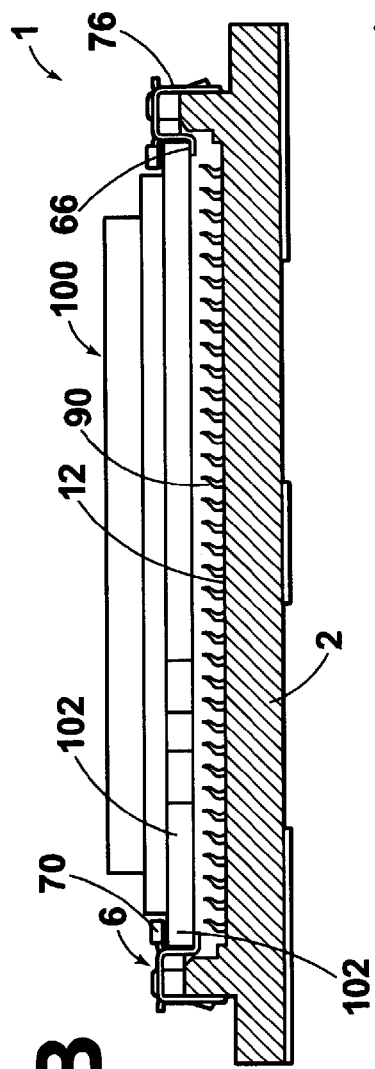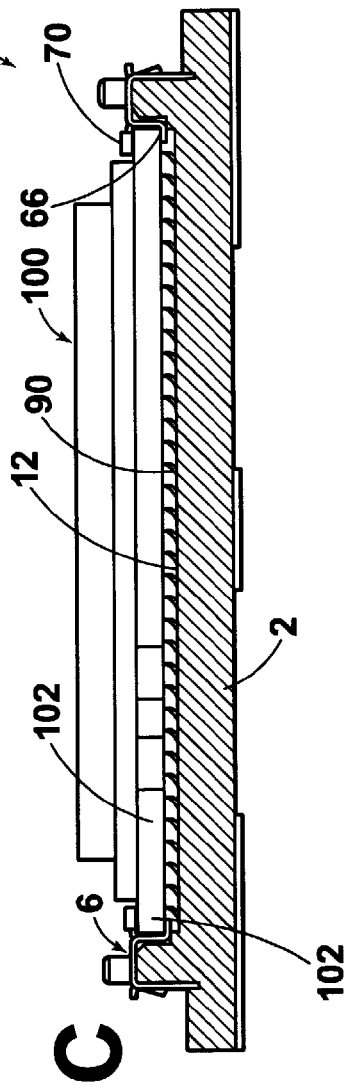

IC SOCKET

RELATED APPLICATION DATA

This is a continuation application of U.S. Ser. No. 11/165,374, filed Jun. 23, 2005 now abandoned.

FIELD OF THE INVENTION

The present invention relates to an IC socket and more particularly, to an IC socket that has a guide member for use during insertion of an IC package.

BACKGROUND OF THE INVENTION

A first example of a known conventional IC socket, is disclosed in Japanese Unexamined Patent Publication No. 6(1994)-151025 (FIG. 1, FIG. 3). This IC socket comprises a housing that holds a large number of contacts and has an IC package positioning base and a rotatable cover plate for pressing an IC package against the positioning base.

A second example of a known IC socket, is disclosed in Japanese Unexamined Patent Publication No. 5(1993)-174924 (FIG. 1, FIG. 3). This IC socket comprises a housing that holds a large number of contacts and has a PGA (Pin Grid Array) type IC package positioning base.

In the first known IC socket, the top of the positioning base is open. Therefore, there is a possibility that a corner of an IC package will strike the contacts of the IC socket, causing them to buckle or become deformed, if the IC package is dropped during mounting onto the IC socket or the like. In addition, there is a possibility that the IC package will not be accurately placed in a predetermined position, and will be mounted in an inclined manner.

In the second known IC socket, the IC package is of the PGA type. Therefore, the contacts of the IC socket are not exposed at an IC package mounting surface thereof. Accordingly, there is no possibility that the contacts will buckle or become deformed by a corner of the IC package, even if the IC package is dropped. However, in the case that the IC package is mounted in an inclined manner, it is difficult to correct the incorrect mounting state thereof. In the case that connections are established while the IC package is mounted in an inclined manner, there is a possibility that pins of the IC package will become deformed.

SUMMARY OF THE INVENTION

The present invention has been developed in view of the foregoing circumstances. It is an object of the present invention to provide an IC socket which is capable of guiding an IC package to the proper position therefore on a mounting surface with good mounting workability, while preventing buckling and deformation of contacts.

It is another object of the present invention to provide an IC socket in which a guide member is stably urged upward, without increasing the number of parts.

The IC socket of the present invention comprises a number of electrical contacts; an insulative socket housing for holding the electrical contacts arranged in a matrix in an IC package mounting surface; an openable/closable cover plate, which is positioned above an IC package to be placed on the IC package mounting surface and a lever for driving the cover plate in a closing direction to press the IC package onto the IC package mounting surface. Furthermore, the IC socket includes a guide member for guiding the IC package onto the IC package mounting surface. The guide member is constituted by a pair of parallel guide rails and a link member that links corresponding ends of the guide rails, attached to the socket housing. Spring arms provided on each of the guide rails and the link member urge the guide member upward from the socket housing. Regulating members are provided for regulating upward movement of the guide member at a position at which the guided IC package is not in contact with the electrical contacts, provided on the socket housing and the guide member. The regulating members may be formed as latch protrusions on the socket housing or engaging pieces on the guide member.

BRIEF DESCRIPTION OF THE DRAWINGS

FIGS. 2A and 2B illustrate the IC socket of FIG. 1, wherein FIG. 2A is a plan view, and FIG. 2B is a side view.

FIGS. 4A, 4B, and 4C illustrate a socket housing of the IC socket of the present invention, wherein FIG. 4A is a plan view, FIG. 4B is a sectional view taken along line 4b-4b of FIG. 4A, and FIG. 4C is a sectional view taken along line 4c-4c of FIG. 4A.

FIGS. 5A, 5B, 5C, 5D, and 5E illustrate a guide member which is utilized in the IC socket of the present invention, wherein FIG. 5A is a plan view, FIG. 5B is a front view, FIGS. 5C and 5D are side views, and FIG. 5E is a rear view.

FIGS. 6A, 6B, and 6C illustrate a state in which the guide member is mounted on the socket housing, wherein FIG. 6A is a plan view, FIG. 6B is a side view, and FIG. 6C is a front view.

FIGS. 7A, 7B, and 7C illustrate the steps of inserting the IC package into the IC socket of the present invention, wherein FIG. 7A illustrates an initial insertion state, FIG. 7B illustrates an intermediate insertion state, and FIG. 7C illustrates a complete insertion state.

FIGS. 8A, 8B, and 8C are sectional views that illustrate the relationship between the guide member and the socket housing, wherein FIG. 8A illustrates a normal state in which the guide member is attached to the socket housing, FIG. 8B illustrates a state in which insertion of the IC package is complete, and FIG. 8C illustrates a state in which an electrical connection has been established between the IC package and the IC socket.

DETAILED DESCRIPTION OF THE EMBODIMENT(S)

Figure 1:
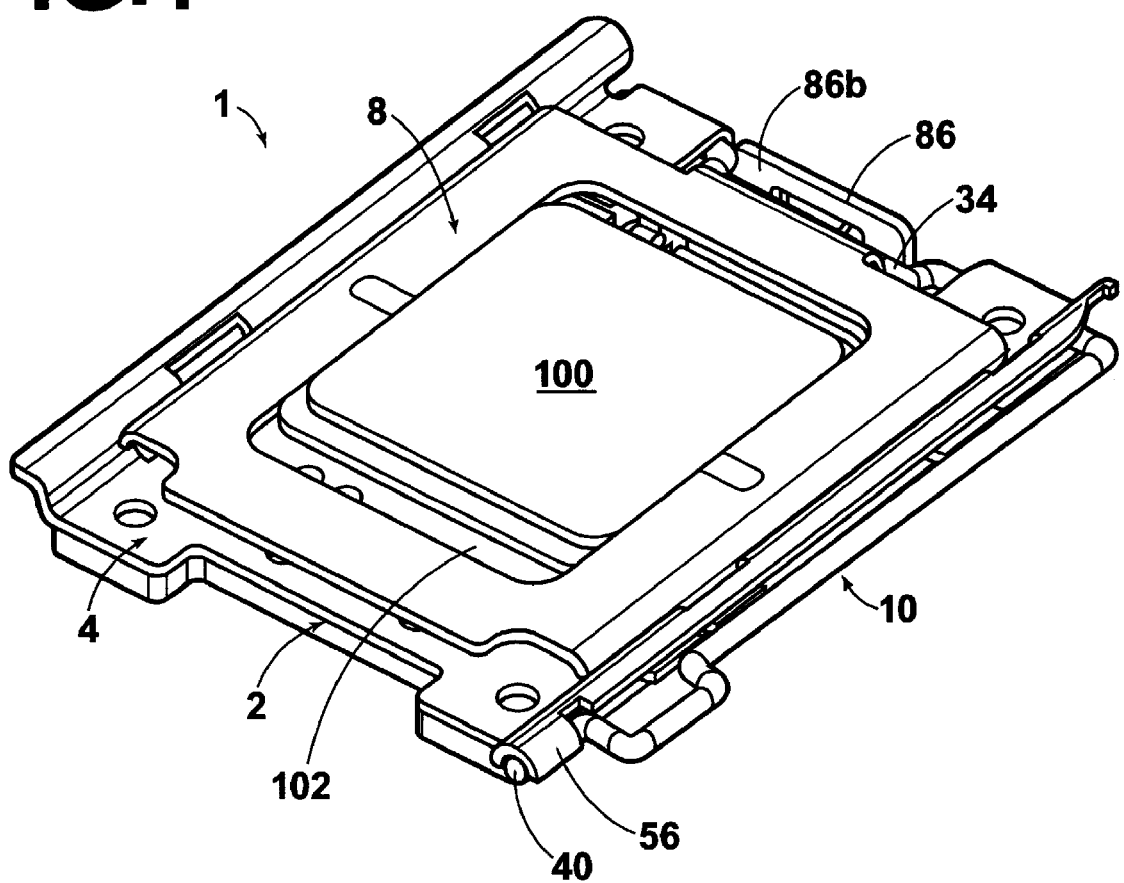
FIG. 1 is a perspective view of the IC socket of the present invention, having an IC package mounted thereon.
Figure 2A:
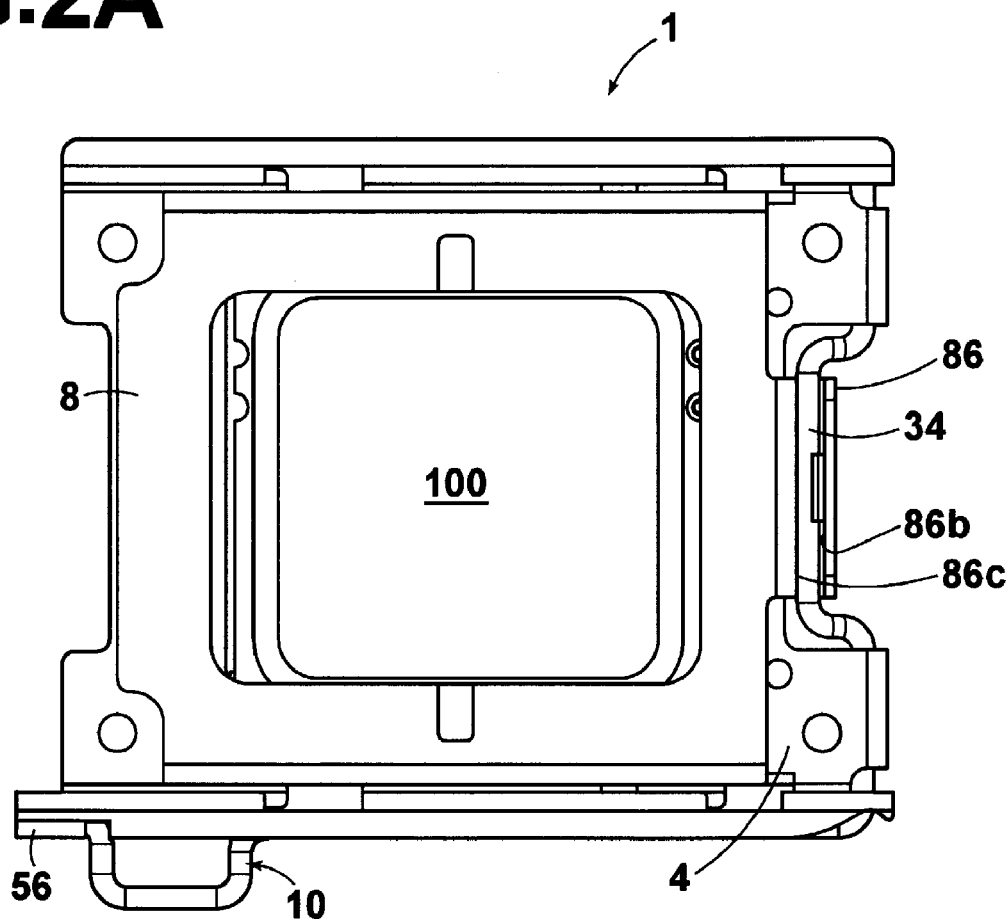
Figure 2B:
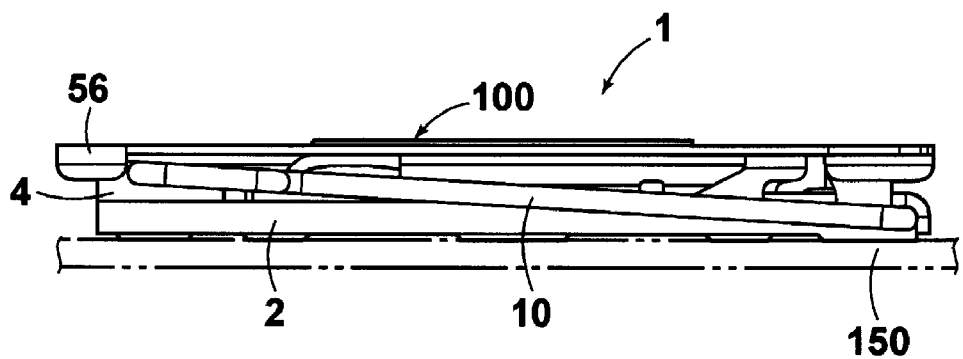

Hereinafter, a preferred embodiment of the IC socket of the present invention will be described in detail with reference to the attached drawings. FIG. 1, FIG. 2A and FIG. 2B illustrate an IC socket 1 of the present invention with an IC package 100 mounted thereon. The IC socket 1 comprises: a socket housing 2 (hereinafter, simply referred to as "housing"), which is to be mounted on a printed circuit board 150 (hereinafter, simply referred to as "circuit board", refer to FIG. 2B); a metallic reinforcing member 4, which is attached to the housing 2; a guide member 6 (refer to FIG. 3), which is attached to the housing 2; a cover plate 8, for pressing the IC package 100, such as a CPU, which is placed on the housing 2; and a lever 10, for driving the cover plate 8. The IC socket 1 illustrated in FIG. 1, FIG. 2A and FIG. 2B has the LGA (Land Grid Array) type IC package 100 completely mounted thereon. That is, FIG. 1, FIG. 2A and FIG. 2B illustrate a state in which an electrical connection is established between the IC package 100 and the IC socket 1.

Figure 3:
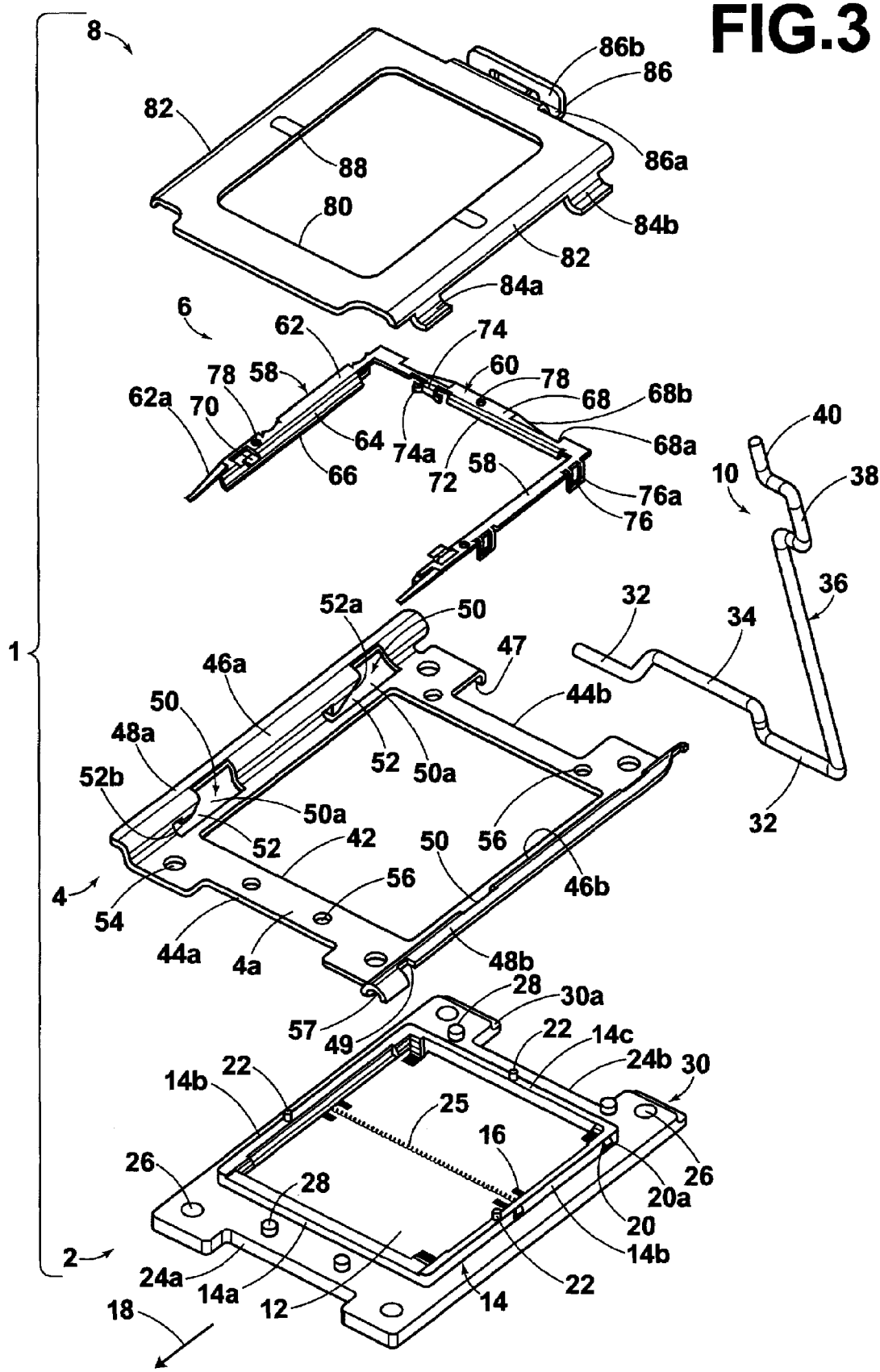
FIG. 3 is an exploded perspective view of the IC socket of FIG. 1.

Next, the IC socket 1 will be described in further detail with reference to FIG. 3. Note that in the following description, reference will be mainly made to FIG. 3, and other figures will be referred to as necessary. First, the housing 2 will be described with combined reference to FIG. 4A, FIG. 4B, and FIG. 4C. Note that in FIG. 3 and FIG. 4A, only a portion of contact cavities are illustrated, and the rest are omitted. The housing 2 is integrally molded from an insulative resin or the like, and has a substantially rectangular planar shape. A rectangular IC package mounting surface 12 is provided at the central portion of the housing 2. Peripheral walls 14 in the form of a rectangular frame are formed so as to surround the IC package mounting surface 12.

A large number of electrical contacts 90 (refer to FIG. 8), which are to be electrically connected to contacts (not shown) of the IC package 100, are provided in the IC package mounting surface 12, arranged in a matrix. That is, contact cavities 16 that penetrate through the housing 2 in the vertical direction are provided in the IC package mounting surface 12, arranged in a matrix. The electrical contacts 90 are inserted and fixed within the contact cavities 16.

The peripheral walls 14 of the housing 2 include a front wall 14a, a pair of side walls 14b and 14b, and a rear wall 14c. Note that here, "front" refers to the direction indicated by arrow 18 of FIG. 3. The IC package 100 is inserted into the IC socket 1 from the front toward the rear, opposite the direction indicated by arrow 18. A pair of horizontally separated regulating members in the form of latch protrusions 20 is integrally formed on the outer surface of each of the side walls 14b. The latch protrusions 20 have inclined surfaces 20a, which are inclined in the vertical direction and protrude outward. Cylindrical posts 22 are formed toward the front of center of the upper surfaces of the side walls 14b and 14b. A similar post 22 is also formed at the center of the upper surface of the rear wall 14c.

A cutout 24a that extends inward from the front edge and a cutout 24b that extends inward from the rear edge are formed at the centers of the front and rear edges of the housing 2. A mounting aperture 26 is provided on both sides of the cutouts 24a and 24b, for a total of four mounting apertures 26. Cylindrical posts 28, for mounting the reinforcing plate to be described later, are formed in the vicinity of the cutouts and between the mounting apertures 26. Lever bearings 30, which have upward facing curved surfaces 30a, are formed at the rear edge of the housing, on both sides of the cutout 24b. Note that the apertures 23 that penetrate through the housing 2 as illustrated in FIG. 4B are apertures which are formed during molding of the latch protrusions 20.

Figure 4A:
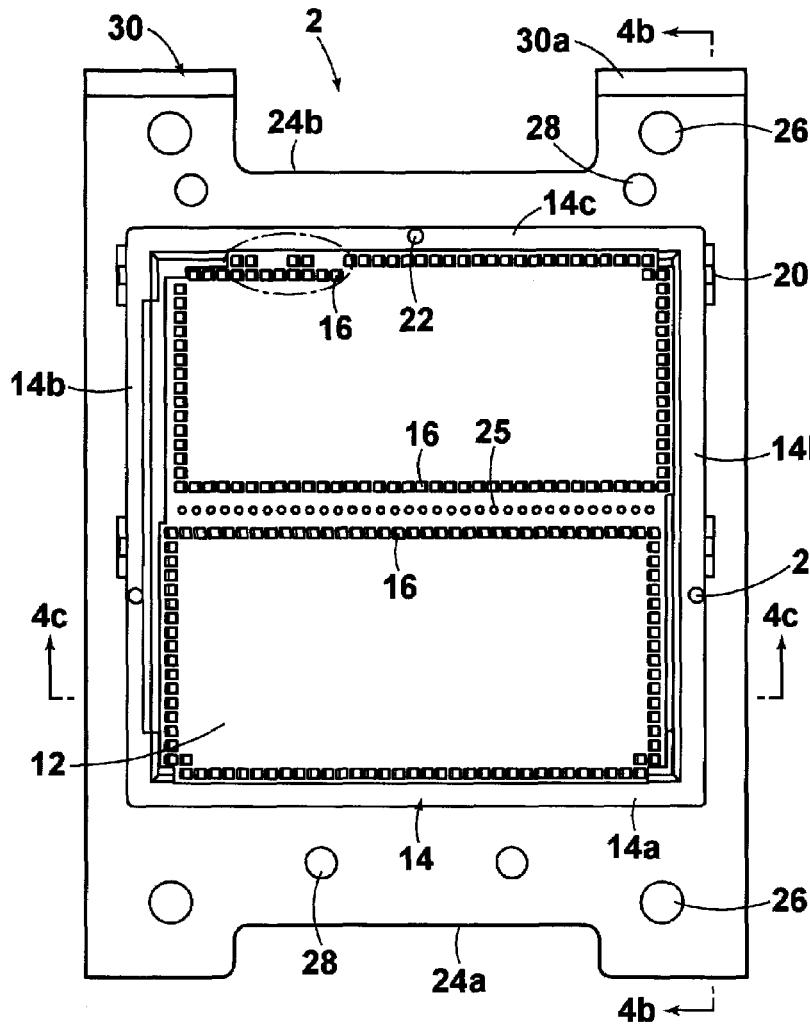
Figure 4B:
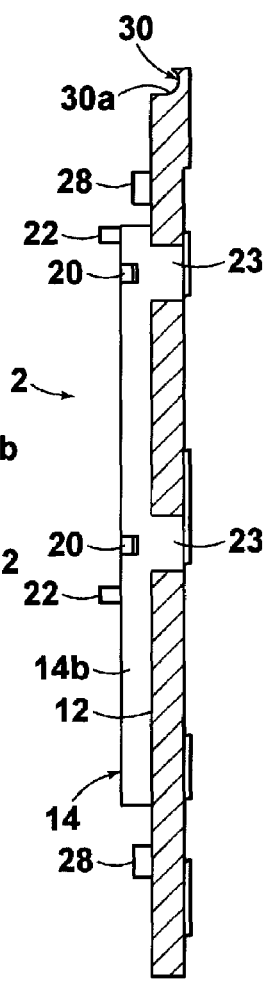
Figure 4C:
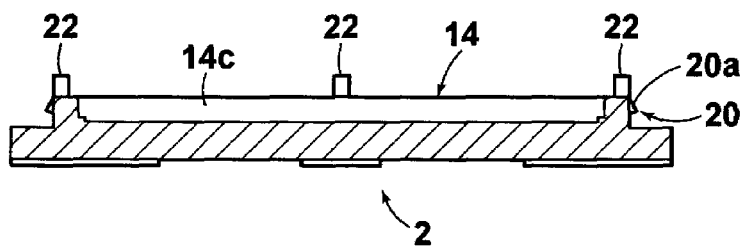

As illustrated in FIG. 4A, a single row of cylindrical support protrusions 25 is formed at the central portion of the IC package mounting surface 12. The support protrusions 25 are spaced at a predetermined pitch in the horizontal direction. The support protrusions 25 support the central lower surface of the IC package 100, which is most likely to become deformed when the IC package 100 is urged downward. The pitch of the support protrusions 25 is the same as the pitch of the contact cavities 16. The contact cavities 16 in the region to the front of the row of support protrusions 25, that is, the region below the row of support protrusions 25 in FIG. 4A, are provided in a matrix, which is shifted ¼ pitch in the horizontal direction with respect to the support protrusions 25.

Meanwhile, in the region to the rear of the row of support protrusions 25, the contact cavities 16 are arranged substantially in a matrix, which is shifted ½ pitch in the horizontal direction with respect to the contact cavities 16 in the forward region. The reason for this arrangement is so that the tips of the electrical contacts 90 do not interfere with the support protrusions 25 when the IC package 100 is connected to the contacts 90 provided within the contact cavities 16. The tips of the electrical contacts 90 in the forward region extend in the upward direction in FIG. 4A, and the tips of the electrical contacts 90 in the rearward region extend in the downward direction in FIG. 4B. Because connection with the IC package 100 causes the electrical contacts 90 to flex, there is a possibility that the tips of the electrical contacts 90 adjacent to the support protrusions 25 will interfere therewith. For this reason, the arrangement has been adopted, such that the tips of the electrical contacts 90 are positioned between adjacent support protrusions 25. Note that there are two locations within the region toward the rear surrounded by the broken line in FIG. 4A, at which contact cavities 16 are not formed. Curved protrusions 74a of the guide member 6 are inserted into this region for keying, to be described later.

Next, the lever 10 will be described with reference to FIG. 3. The lever 10 is formed by bending a single metal wire. The lever 10 comprises: axially separated shaft portions 32, which are to be placed in the lever bearings 30 of the housing 2; a crank portion 34, which is positioned between the shaft portions 32 and is shifted therefrom; and an operating arm 36 that extends in the same direction as the crank portion 34 from one of the shaft portions 32. The operating arm 36 comprises: a finger applying portion 36, which is formed by bending the operating arm 36 in the vicinity of a free end thereof into a C-shape; and an engaging portion 40 further toward the free end from the finger applying portion 36.

Next, the reinforcing plate 4 will be described with reference to FIG. 3. The reinforcing plate 4 is formed by stamping and forming a single metal plate, and is of a rectangular shape similar to that of the housing 2. A rectangular opening 42, for receiving the peripheral walls 14 of the housing 2, is formed at the central portion of a main surface 4a of the reinforcing plate 4. Cutouts 44a and 44b are also formed in the reinforcing plate 4, at positions that correspond to those of the cutouts 24a and 24b. The cutout 44a, which is positioned at the front, is comparatively shallow, while the rearward cutout 44b is comparatively deep. Side walls 46 (46a, 46b) are formed by bending both sides of the main surface 4a. The side walls 46 are to be positioned to the exterior of the side walls 14b of the housing 2. The upper ends of the side walls 46 are bent outward, to form upper edge portions 48 (48a, 48b). A pair of cam openings 50, which are separated in the longitudinal direction, are formed in each side wall 46.

Each cam opening 50 comprises: a receiving portion 50a that extends downward from the upper edge portion 48 to the main surface 4a; and a cam groove 52 (cam engaging portion) that extends forward from the lower portion of the receiving portion 50a. Each cam groove 52 comprises: an upper cam surface 52a that inclines downward toward the front of the cam groove 52; and a stop portion 52b, which is formed by an upwardly extending cutout at the tip of the cam surface 52a. Mounting apertures 54 are formed through the main surface 4a at positions corresponding to the mounting apertures 26 of the housing 2. In addition, apertures 56, for the cylindrical posts 28 to be inserted through, are formed at positions corresponding to the cylindrical posts 28.

The reinforcing plate 4 is positioned with respect to the housing 2 by the cylindrical posts 28 being inserted into the apertures 56. A lever stop 57 is formed at the front portion of the side wall 46b, by forming a cutout in the upper edge portion 48b, then bending the separated portion downward. Mounting screws (not shown) are inserted through the mounting apertures 54 of the reinforcing plate 4 and the mounting apertures 26 of the housing 2. The mounting screws penetrate through the circuit board 150, and are fixed to a metal plate on the opposite surface of the circuit board 150 by threaded engagement. Warping of the housing 2 is thereby prevented and the IC socket 1 is fixed to the circuit board 150. In addition, the downwardly curved portions 47 at the rear end of the reinforcing plate 4 constitute the lever bearings 30.

Next, the guide member 6 will be described with combined reference to FIG. 5A, FIG. 5B, FIG. 5C, FIG. 5D, and FIG. 5E. The guide member 6 is formed by stamping and forming a single resilient metal plate. The guide member 6 comprises a pair of parallel guide rails 58, at positions corresponding to the side walls 14b and 14b of the housing 2. The rear ends of the guide rails 58 are linked by a link member 60. Each guide rail 58 comprises: an upper wall 62; a guide wall 64 that extends downward from the inner edge of the upper wall 62 and has the same length as the upper wall 62; and an upwardly facing guide surface 66, which is positioned at the lower edge of the guide wall 64, has the same length as the guide wall 64, and extends along the guide wall 64. A stopper 70 that faces the guide surface 66 is partially formed by cutting and bending in the vicinity of the front end of the upper wall.

A pair of cutouts 68a, which are separated from each other, is formed in an upper wall 68 of the link member 60. Spring arms 68b that extend along the longitudinal direction of the link member 60 extend obliquely downward from opposing inner edges of the cutouts 68a. A stop surface 72 hangs downward from the inner side of the upper wall 68 and extends along the upper wall 68. A tab 74 that hangs downward from the upper wall 68 is formed to the left of the stop surface 72 in FIG. 3. The forward facing curved protrusions 74a and 74a are formed on both sides of the tab 74.

Recesses (not shown) that correspond to the curved protrusions 74a and 74a are formed at two locations in the IC package 100. When the IC package 100 is inserted into the IC socket 1, the IC package 100 cannot be accurately placed unless the curved protrusions 74a and 74a mate with the recesses. That is, the curved protrusions 74a and 74a serve as keys for the IC package 100.

Additional regulating members formed as engaging pieces 76, which have engaging openings 76a, hang down from the exterior sides of the upper walls 62 of each of the guide rails 58, at positions corresponding to the latch protrusions 20 of the housing 2. Apertures 78 are formed through the upper walls 62 of the guide rails 58 and through the upper wall 68 of the link member 60, at positions that correspond to those of the posts 22 of the housing 2.

Next, mounting of the guide member 6 onto the hosing 2 will be described with combined reference to FIG. 6A, FIG. 6B, and FIG. 6C. FIGS. 6A, 6B, and 6C illustrate a state in which the guide member 6 is mounted on the housing 2. First the posts 22 of the housing 2 and the apertures 78 of the guide member 6 are aligned, and the guide member 6 is pressed onto the housing 2 from above. Thereby, the engaging pieces 76 of the guide member 6 spread open along the inclined surfaces 20a of the latch protrusions 20. The engaging pieces 76 return to their original states at a predetermined position, and the latch protrusions 20 engage with the engaging openings 76a of the engaging pieces 76.

At this time, the tips of the spring arms 62a and 68b, that is, the free ends thereof, abut the upper surfaces of the side walls 14b and the rear wall 14c to urge the guide member 6 upward. However, because the latch protrusions 20 are engaged with the engaging pieces 76, the guide member 6 is not disengaged from the housing 2, but is maintained in a state in which it floats above the peripheral walls 14 at a predetermined distance. Accordingly, when the guide member 6 is pressed from above, the guide member 6 descends without changing its relative position with respect to the reinforcing plate 4 in the horizontal direction, due to the engagement among the posts 22 and the apertures 78. That is, the guide member 6 is mounted onto the housing such that it is freely movable in the vertical direction, within a predetermined range.

Next, the cover plate 8 will be described with reference to FIG. 3. The cover plate 8 is a planar member formed by stamping and forming a single metal plate. A rectangular opening 80, for housing the upper portion of the IC package 1 is formed at the central portion of the cover plate 8. Edge portions 82 and 82 are formed at two sides, by bending the edges downward in an arcuate manner. Laterally protruding cam tongue pieces 84 (84a, 84b) are formed on the lower ends of each of the edge portions 82, at positions corresponding to those of the cam openings 50. The cam tongue pieces 84 are constituted by front cam tongue pieces 84a and rear cam tongue pieces 84b, which are separated from each other in the longitudinal direction.

A crank engaging portion 86 is formed at the center of the rear portion of the cover plate 8. The crank engaging portion 86 comprises a groove 86a that extends downward from the rear end of the cover plate 8 then curves back upward in substantially a U-shape. The crank portion 34 of the lever 10 is placed in the crank engaging portion 86. The engagement state between the crank portion 34 and the crank engaging portion 86 will be described with reference to FIG. 2. The crank portion 34 is housed within the groove 86a of the crank engaging portion 86. A rear wall 86b of the crank engaging portion 86 is pressed rearward by rotation of the crank portion, to raise and open the front of the cover plate 8. In addition, a front wall 86c is pressed forward, to slide the cover plate 8 forward.

Once again referring to FIG. 3, downwardly facing protrusions 88 are press molded at the centers, in the longitudinal direction, of both sides of the cover plate 8. The protrusions 88 are provided to press the central portion, in the longitudinal direction, of the IC package comparatively strongly, in order to uniformize contact pressure between the IC package 100 and the electrical contacts 90. The protrusions 88 and the support protrusions 25 of the housing 2 are in a correspondent relationship.

Next, the manner in which the IC package 100 is mounted onto the IC socket 1, constructed as described above, will be described with reference to FIGS. 7A, 7B, 7C, 8A, 8B, and 8C. FIGS. 7A, 7B, and 7C illustrate the steps of inserting the IC package 100 into the IC socket, wherein FIG. 7A illustrates an initial insertion state, FIG. 7B illustrates an intermediate insertion state, and FIG. 7C illustrates a complete insertion state. Note that the reinforcing plate 4 is omitted from FIGS. 7A, 7B, and 7C.

FIGS. 8A, 8B, and 8C are sectional views that illustrate the relationship between the guide member 6 and the housing 2, wherein FIG. 8A illustrates a normal state in which the guide member 6 is attached to the housing 2, FIG. 8B illustrates a state in which insertion of the IC package 100 is complete, and FIG. 8C illustrates a state in which an electrical connection has been established between the IC package 100 and the IC socket 1. Note that the reinforcing plate 4, the cover plate 8, and the lever 10 are omitted from FIGS. 8A, 8B, and 8C.

When the guide member 6 is mounted onto the housing 2, the guide member 6 is maintained in a state in which it floats slightly above the peripheral walls 14 of the housing 2, by the engagement among the latch protrusions 20 and the engaging pieces 76, as illustrated in FIG. 8A. That is, a state is maintained, in which the IC package 100 to be inserted does not contact the contacts 90. Next, as illustrated in FIG. 7A, the IC package 100 is inserted from the front of the IC socket 1 along the guide member 6, which is in the floating state. At this time, a flange 102 that extends outward from the lower portion of the IC package is inserted between the guide surfaces 66 and the stoppers 70 of the guide rails 58. As illustrated in FIG. 7A, the cover plate 8 has been opened in advance by operating the lever 10, so the IC package 100 can simply be inserted. Then, as illustrated in FIG. 7B, the IC package is inserted further along the guide surfaces 66. The insertion is performed until the flange 102 of the IC package 100 abuts the stop surface 72 of the guide member 6. At this time, the guide member 6 is still in the floating state. For this reason, the IC package 100 does not contact the contacts 90. In addition, the IC package mounting surface 12 is covered by the cover plate 8, therefore there is no possibility that the IC package 100 will be dropped onto the IC package mounting surface 12.

When the flange 102 of the IC package 100 is positioned above the IC package mounting surface 12 as illustrated in FIG. 7C, insertion of the IC package 100 is complete. This state is illustrated in the sectional view of FIG. 8B, in which the IC package 100 is held on the floating guide member 6. However, the IC package 100 is still not in contact with the electrical contacts 90 provided in the IC package mounting surface 12.

Next, the lever 10 is rotated to press the cover plate 8 downward. The cam tongue pieces 84 of the cover plate 8 enter the receiving portion 50a of the reinforcing plate 4 from above. By further rotation of the lever 10, the cam tongue pieces 84 enter the cam grooves 52 of the reinforcing plate to engage therewith, thereby pressing the cover plate 8 against the IC package. Thereby, the IC package 100 is pressed downward to press the guide member 6 downward and to establish electrical connections among the electrical contacts (not shown) of the IC package 100 and the electrical contacts 90 of the IC socket 1. By the establishment of the electrical connections, mounting of the IC package 100 onto the IC socket 1 is completed.

After mounting is complete, the engaging portion 40 of the lever 10 is engaged with the lever stop 57, to lock the IC package 100 and the IC socket in the connected state.

In the above embodiment, the IC package was of the LGA type. Alternatively, the IC package may be of the BGA (Ball Grid Array) type. In addition, the means by which upward movement of the guide member is regulated is not limited to that described in the above embodiment, and may be of another construction, such as engaging pieces on the housing and latch protrusions on the guide member.

The IC socket 1 of the present invention exhibits the following advantageous effects. The mounting workability is improved, because the IC package 100 is guided to the proper position therefore on the IC package mounting surface 12 by the guide member 6. The IC package 100 is inserted while being guided at positions at which the IC package 100 does not contact the electrical contacts 90 during mounting. Therefore, the IC package 100 cannot be dropped onto the IC package mounting surface 12, and accordingly, buckling and deformation of the contacts 90 due to such dropping of the IC package 100 can be prevented. The guide member 6 comprises: the pair of parallel guide rails 58, for guiding the IC package 100; the link member 60 for linking the corresponding ends of the guide rails 58 with each other; and the spring arms that urge the guide member upward from the socket housing. Therefore, a guide member 6 which is urged upward can be constructed using a small number of parts.

The regulating members may be constituted by the latch protrusions on the socket housing and by the engaging pieces 76 on the guide member 6. In this case, the guide member 6 can be made to be capable of vertical movement within a predetermined range with a simple construction, in cooperation with the spring arms of the guide member 6.

What is claimed is:

1. An IC socket, comprising:
   electrical contacts;
   an insulative socket housing for holding the electrical contacts in a matrix in an IC package mounting surface;
   an openable/closeable cover plate, which is positioned above an IC package to be placed on the IC package mounting surface;
   a lever, for driving the cover plate in a closing direction to press the IC package onto the IC package mounting surface;
   a guide member for guiding the IC package onto the IC package mounting surface, the guide member having a pair of parallel guide rails and a link member that links corresponding ends of the guide rails, attached to the socket housing;
   spring arms provided on each of the guide rails and the link member, for urging the guide member upward from the socket housing; and
   regulating members provided on the socket housing and the guide member, for regulating upward movement of the guide member at a position at which the guided IC package is not in contact with the electrical contacts.

2. An IC socket as defined in claim 1, wherein the regulating members comprise latch protrusions on the socket housing and engaging pieces on the guide member.

3. An IC socket as defined in claim 1, further comprising a metallic reinforcing member which has side walls having cam engaging portions formed thereon and are positioned outside the IC package mounting surface and cam engaging portions at two edges of the cover plate that correspond in position to the side walls, wherein the cover plate is driven by the lever to slide against the metallic reinforcing member, the cam engaging portions engage each other and the IC package, which is placed on the IC package mounting surface, is pressed toward the socket housing.

4. An IC socket as defined in claim 2, further comprising a metallic reinforcing member which has side walls having cam engaging portions formed thereon and are positioned outside the IC package mounting surface and cam engaging portions at two edges of the cover plate that correspond in position to the side walls, wherein the cover plate is driven by the lever to slide against the metallic reinforcing member, the cam engaging portions engage each other and the IC package, which is placed on the IC package mounting surface, is pressed toward the socket housing.

5. An IC socket as defined in claim 3, wherein the lever has a crank portion and the cover plate is swung by the lever.

6. An IC socket as defined in claim 4, wherein the lever has a crank portion and the cover plate is swung by the lever.

7. An IC socket as defined in claim 1, wherein the guide rails comprise upwardly facing guide surfaces and stoppers that face the guide surfaces wherein the IC package is guided by the guide surfaces and the stoppers.

8. An IC socket as defined in claim 2, wherein the guide rails comprise upwardly facing guide surfaces and stoppers that face the guide surfaces wherein the IC package is guided by the guide surfaces and the stoppers.

9. An IC socket as defined in claim 3, wherein the guide rails comprise upwardly facing guide surfaces and stoppers that face the guide surfaces wherein the IC package is guided by the guide surfaces and the stoppers.

10. An IC socket as defined in claim 5, wherein the guide rails comprise upwardly facing guide surfaces and stoppers that face the guide surfaces wherein the IC package is guided by the guide surfaces and the stoppers.

11. An IC socket, comprising:
    electrical contacts;
    an insulative socket housing for holding the electrical contacts in a matrix in an IC package mounting surface;
    an openable/closeable cover plate, which is positioned above an IC package to be placed on the IC package mounting surface;
    a lever, for driving the cover plate in a closing direction to press the IC package onto the IC package mounting surface; and
    a metallic reinforcing member which has a side wall having a cam engaging portion formed thereon which is positioned outside the IC package mounting surface and a cam engaging portion at an edge of the cover plate that corresponds in position to a side wall, wherein the cover plate is driven by the lever to slide against the metallic reinforcing member, and the IC package, which is placed on the IC package mounting surface, is pressed toward the socket housing.

12. An IC socket as defined in claim 11, wherein the lever has a crank portion and the cover plate is swung by the lever.

13. An IC socket as defined in claim 11, further comprising:
    an alignment protrusion extending from the insulative socket housing; and
    a receptacle formed in the reinforcing member for receiving the alignment protrusion.

14. An IC socket as defined in claim 13, wherein the alignment protrusion is substantially cylindrical in shape.

15. An IC socket as defined in claim 11, the reinforcing member further comprising:
    a lever stop for releasably retaining a portion of the lever while the IC package interfaces the IC package mounting surface.

16. An IC socket as defined in claim 11, further comprising:
    an insulative socket housing mounting aperture; and
    a reinforcing member mounting aperture aligned with the insulative socket housing mounting aperture.

17. An IC socket as defined in claim 11, the cover plate further comprising:
    a downwardly facing cover plate protrusion for applying pressure to a central portion of the IC package.

18. An IC socket as defined in claim 11, the insulative socket housing further comprising:
    a housing support protrusion for supporting a central lower surface of the IC package.

19. An IC socket as defined in claim 11, the cover plate further comprising:
    a cam tongue piece configured to engage a cam opening formed in the reinforcing member.

20. An IC socket as defined in claim 19, the cam opening comprising:
    a cam slot.

* * * * *

UNITED STATES PATENT AND TRADEMARK OFFICE
CERTIFICATE OF CORRECTION

| | | |
|---|---|---|
| PATENT NO. | : 7,291,022 B2 | Page 1 of 1 |
| APPLICATION NO. | : 11/530738 | |
| DATED | : November 6, 2007 | |
| INVENTOR(S) | : Shinsaku Toda et al. | |

It is certified that error appears in the above-identified patent and that said Letters Patent is hereby corrected as shown below:

On the Title page Item (73) Assignee: "Tyco Elctronics AMP K.K." should read --Tyco Electronics AMP K.K.--.

Signed and Sealed this

Seventeenth Day of June, 2008

JON W. DUDAS
*Director of the United States Patent and Trademark Office*